(12) United States Patent
Takahashi et al.

(10) Patent No.: US 10,505,508 B2
(45) Date of Patent: Dec. 10, 2019

(54) CONFIGURATION METHOD OF AUDIO EQUIPMENT AND AUDIO EQUIPMENT

(71) Applicant: Yamaha Corporation, Hamamatsu-shi, Shizuoka (JP)

(72) Inventors: Daisuke Takahashi, Hamamatsu (JP); Akio Suyama, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 16/137,634

(22) Filed: Sep. 21, 2018

(65) Prior Publication Data

US 2019/0028076 A1    Jan. 24, 2019

Related U.S. Application Data

(63) Continuation of application No. PCT/JP2017/011645, filed on Mar. 23, 2017.

(30) Foreign Application Priority Data

Mar. 23, 2016   (JP) .................................. 2016-058000
Mar. 23, 2016   (JP) .................................. 2016-058001

(51) Int. Cl.
  *H04R 3/14*    (2006.01)
  *H04R 3/04*    (2006.01)
  (Continued)

(52) U.S. Cl.
  CPC ........... *H03G 3/002* (2013.01); *H03G 3/3005* (2013.01); *H03G 5/165* (2013.01); *H04R 3/14* (2013.01);
  (Continued)

(58) Field of Classification Search
  CPC ............. H03G 2201/103; H03G 3/002; H03G 3/3005; H03G 3/3026; H03G 5/165;
  (Continued)

(56) References Cited

U.S. PATENT DOCUMENTS 6,674,864 B1 *  1/2004  Kitamura ............... H03G 5/005
                                              381/103
6,775,385 B1 *  8/2004  Coombs ................... H04R 3/04
                                              381/98

(Continued)

OTHER PUBLICATIONS

International Search Report (PCT/ISA/210) issued in PCT Application No. PCT/JP2017/011645 dated Jun. 6, 2017 with English translation (four (4) pages).

(Continued)

*Primary Examiner* — Vivian C Chin
*Assistant Examiner* — Friedrich Fahnert
(74) *Attorney, Agent, or Firm* — Crowell & Moring LLP (57) ABSTRACT

An configuration method of audio equipment includes, a first step of preparing a plurality of configuration data sets; a second step of receiving, from a user, selection of one output configuration from among a plurality of output configurations; a third step of receiving, from the user, selection of one input configuration from among input configurations restricted by the selected one output configuration; a fourth step of selecting one amplifier mode from among a plurality of amplifier modes based on the selected one output configuration and the selected one input configuration; and a fifth step of selecting a configuration data set corresponding to the selected one amplifier mode, and applying the selected configuration data set to signal processing to be performed by the signal processor.

14 Claims, 8 Drawing Sheets

(51) Int. Cl.
*H03G 3/00* (2006.01)
*H03G 3/30* (2006.01)
*H03G 5/16* (2006.01)

(52) U.S. Cl.
CPC ......... *H03G 2201/103* (2013.01); *H04R 3/04* (2013.01)

(58) Field of Classification Search
CPC . H03G 7/002; H04R 3/04; H04R 3/12; H04R 3/14; H04S 7/308
USPC ......... 381/1, 2, 28, 59, 79, 86, 94.1, 98, 99, 381/103, 119, 120, 123, 300, 302
See application file for complete search history.

(56) References Cited

U.S. PATENT DOCUMENTS

| | | | |
|---|---|---|---|
| 9,319,792 B1* | 4/2016 | Coleman | H04R 3/12 |
| 9,351,077 B1* | 5/2016 | Ford | H04B 1/1676 |
| 2003/0021433 A1* | 1/2003 | Lee | H04R 5/02 |
| | | | 381/302 |
| 2010/0284543 A1* | 11/2010 | Sobota | H04R 27/00 |
| | | | 381/2 |
| 2011/0280407 A1* | 11/2011 | Skinner | H03G 3/3005 |
| | | | 381/28 |
| 2013/0028449 A1* | 1/2013 | Luo | H04M 1/60 |
| | | | 381/123 |
| 2014/0029763 A1* | 1/2014 | Takada | H03F 3/68 |
| | | | 381/94.1 |
| 2016/0072465 A1* | 3/2016 | Das | H03G 3/20 |
| | | | 381/120 |
| 2016/0253145 A1* | 9/2016 | Lee | G06F 3/04883 |
| | | | 381/79 |
| 2016/0301488 A1* | 10/2016 | Tillman | H04H 60/05 |
| 2017/0142536 A1* | 5/2017 | Hattori | H04N 5/60 |

OTHER PUBLICATIONS

"Yamaha Speaker Processor SP 2060 Owner's Manual", 2007, Yamaha Corporation, Japan with English translation (113 pages).

* cited by examiner

| OUTPUT CONFIGURATION | INPUT: 2ch ALL STAGES: 2ch | INPUT: 1ch ALL STAGES: 2ch | INPUT: 1ch SUBSEQUENT STAGE: 2ch | INPUT: 1ch ALL STAGES: 1ch | INPUT: 2ch MIX |
|---|---|---|---|---|---|
| FULL+FULL | MODE 1 (a1, b1) | MODE 2 (a2, b1) | | | MODE 3 (a3, b1) |
| SUB+SUB | MODE 4 (a1, b1) | MODE 5 (a2, b1) | | | MODE 6 (a3, b1) |
| FULL+SUB | MODE 7 (a1, b1) | | MODE 8 (a1, b2) | | MODE 9 (a3, b2) |
| BI-AMP | | | MODE 10 (a1, b2) | | MODE 11 (a3, b2) |
| FULL(BOOST) | | | | MODE 12 (a1, b3) | MODE 13 (a3, b3) |
| SUB(BOOST) | | | | MODE 14 (a1, b3) | MODE 15 (a3, b3) |

FIG.7A

ICONS OF SP TYPES

FIG.7B

ICONS OF ROUTING

FIG.8

CONFIGURATION METHOD OF AUDIO EQUIPMENT AND AUDIO EQUIPMENT

CROSS-REFERENCE TO RELATED APPLICATION

The present application is continuation of International Application No. PCT/JP2017/011645, filed on Mar. 23, 2017, which claims priority from Japanese Application No. JP2016-058000 filed on Mar. 23, 2016 and No. JP2016-058001 filed on Mar. 23, 2016. The contents of these applications are hereby incorporated by reference into this application.

BACKGROUND OF THE INVENTION

1. Field of the Invention

This disclosure relates to a configuration method of audio equipment, for example, a power amplifier, and an audio equipment, with which settings suitable for a mode of use of a speaker can be made easily.

2. Description of the Related Art

For a related-art power amplifier without a signal processing function, in order to sound a speaker optimally, there may be used a speaker processor including an equalizer and a filter to equalize characteristics of a sound emitted from the speaker or to produce a sound, which is to be connected to the previous stage.

An example of the above-mentioned speaker processor is described in Non-patent Document "YAMAHA SPEAKER PROCESSOR SP 2060 Owner's Manual (online), (retrieved on Jan. 27, 2016), Internet <http://download.yamaha.com/api/asset/file?language=ja&site=countrysite-master.prod.wsys.yamaha.com&asset_id=47915>". This speaker processor includes components of various functions for adjusting the speaker, such as an equalizer and a delay device, and a user changes parameters of the components to adjust the effects of signal processing. When the speaker processor is adjusted suitably, optimal processing can be performed on various speakers.

SUMMARY OF THE INVENTION

Types of speaker systems include a full-range system, which covers the full audible range, and a subwoofer, which is in charge of only a low range in the audible range. Moreover, full-range systems include a system that allows bi-amp connection, which includes a low-range speaker and a high-range speaker, and includes input terminals dedicated to the respective speakers. Moreover, each of the speaker systems has sound characteristics specific to the system even when the systems are of the same type. For example, the systems may be different in emittable frequency bandwidth, or in sound pressure level that can be output in the band or allowable input power. Moreover, a plurality of speaker systems may be used in combination in some cases. It is required for a user to use a speaker processor to adjust an output signal of each channel (ch) of the power amplifier to characteristics suitable for a speaker system connected to the channel. It is also required for the user to set a signal path and the like in the speaker processor depending on a mode of use of the speaker as appropriate.

However, there has been a problem in that it is difficult for a poorly-skilled user or a beginner to set in the speaker processor the signal path and parameter values of the respective components depending on modes of use and the characteristics of the speakers.

In view of the above-mentioned problem, it is an object of this disclosure to provide a configuration method of audio equipment, for example, a power amplifier, with which even a poorly-skilled user can easily make settings suitable for the mode of use of a speaker.

In order to achieve the above-mentioned object, according to one embodiment of this disclosure, there is provided a configuration method of audio equipment. The audio equipment includes a signal processor, which is connected to n input devices and m output devices, where n is an integer of 1 or more and m is an integer of 1 or more. The configuration method of audio equipment includes, a first step of preparing a plurality of configuration data sets; a second step of receiving, from a user, selection of one output configuration from among a plurality of output configurations; a third step of receiving, from the user, selection of one input configuration from among input configurations restricted by the selected one output configuration; a fourth step of selecting one amplifier mode from among a plurality of amplifier modes based on the selected one output configuration and the selected one input configuration; and a fifth step of selecting a configuration data set corresponding to the selected one amplifier mode, and applying the selected configuration data set to signal processing to be performed by the signal processor.

In addition to the above-mentioned embodiment as the method, this disclosure may be embodied in any mode, for example, a system or an apparatus.

According to this disclosure described above, even a poorly-skilled user can set the audio equipment, for example, the power amplifier, easily depending on the mode of use of the speaker.

DETAILED DESCRIPTION OF THE INVENTION

Now, a mode for embodying this disclosure is specifically described with reference to the drawings.

Figure 1:
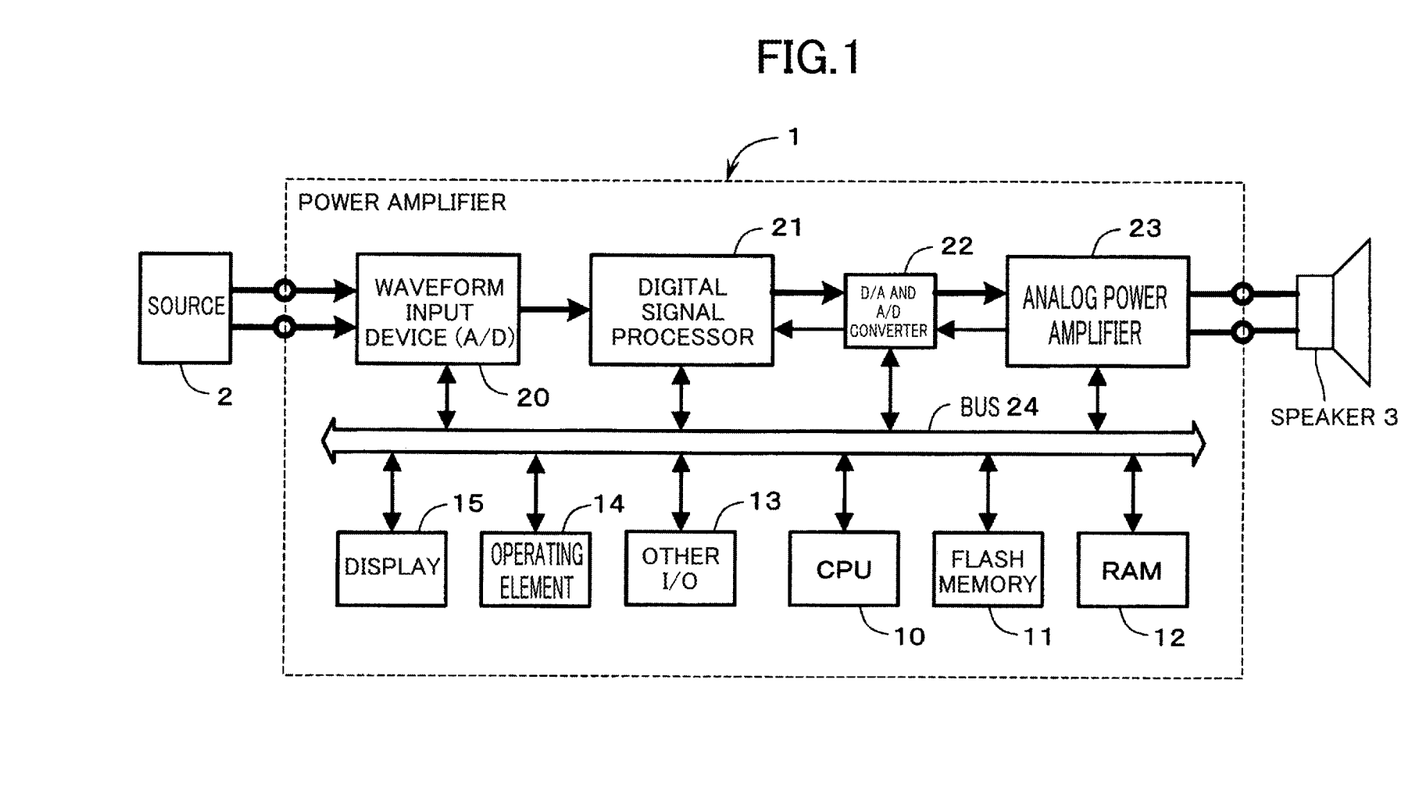
FIG. 1 is a block diagram for illustrating a configuration of a power amplifier (1) in a configuration method according to one embodiment of this disclosure.

First, FIG. 1 is a block diagram for illustrating a configuration of a power amplifier 1 in a configuration method according to one embodiment of this disclosure.

The power amplifier 1 of FIG. 1 basically has a 2-channel (2ch) configuration including channel A (Ach) and channel B (Bch). The power amplifier 1 includes a central processing unit (CPU) 10, a flash memory 11, a random access memory (RAM) 12, other I/O 13, an operating element 14, a display 15, a waveform input device 20, a digital signal processor 21, a D/A and A/D converter 22, and an analog power amplifier 23, which are connected to each other via a bus 24. The digital signal processor 21 is formed of one or more digital signal processors (DSPs).

Of those components, the CPU 10 is a controller configured to perform centralized control of operation of the power amplifier 1. The CPU 10 is configured to execute a control program stored in the memory 11 to edit parameters, control the display 15, or control signal processing performed by the digital signal processor 21 depending on an operation on the operating element 14. The flash memory 11 is a rewritable non-volatile memory. The flash memory 11 is configured to store, in addition to the control program, a plurality of configuration data sets, a plurality of SP presets corresponding to a plurality of speakers, and other such data. One of the plurality of configuration data sets is identified by an amplifier mode, which is to be described later, and each configuration data set defines a path of a sound signal from input devices to output devices, and signal processing in the path. The RAM 12 is a volatile memory to and from which the CPU 10 writes and reads various kinds of data. The RAM 12 is used as a work memory of the CPU 10, and a current memory configured to store a plurality of parameters for controlling the current operation of the amplifier 1. The other I/O 13 is an interface to which various external devices are connected for communication. As a specification used for the communication in the other I/O 13, any specification may be adopted, for example, Ethernet (trademark) or a universal serial bus (USB), which may be wired or wireless. The display 15 is a display configured to display various kinds of information in accordance with the control by the CPU 10. The display 15 is a liquid crystal panel (LCD) or a light emitting diode (LED), for example.

A configuration of a path of the sound signal from the input devices to the output devices is described. The waveform input device 20 receives, through two input terminals of the amplifier 1, two analog sound signals (input signals) of channel A and channel B from an external source 2, converts the analog sound signals into digital sound signals, and supplies the digital sound signals to the digital signal processor 21. The digital signal processor 21 performs signal processing, for example, crossover processing, delay processing, equalizer processing, limiter processing, and dynamics processing, on the supplied two digital sound signals. The digital signal processor 21 outputs the processed two sound signals to the D/A and A/D converter 22. The D/A and A/D converter 22 converts the two digital sound signals into analog sound signals, and supplies the analog sound signals to the analog power amplifier 23. The analog power amplifier 23 power-amplifies the two analog sound signals, and outputs the power-amplified sound signals (output signals) of channel A and channel B to one or two speakers 3 connected to speaker terminals.

Figure 2:
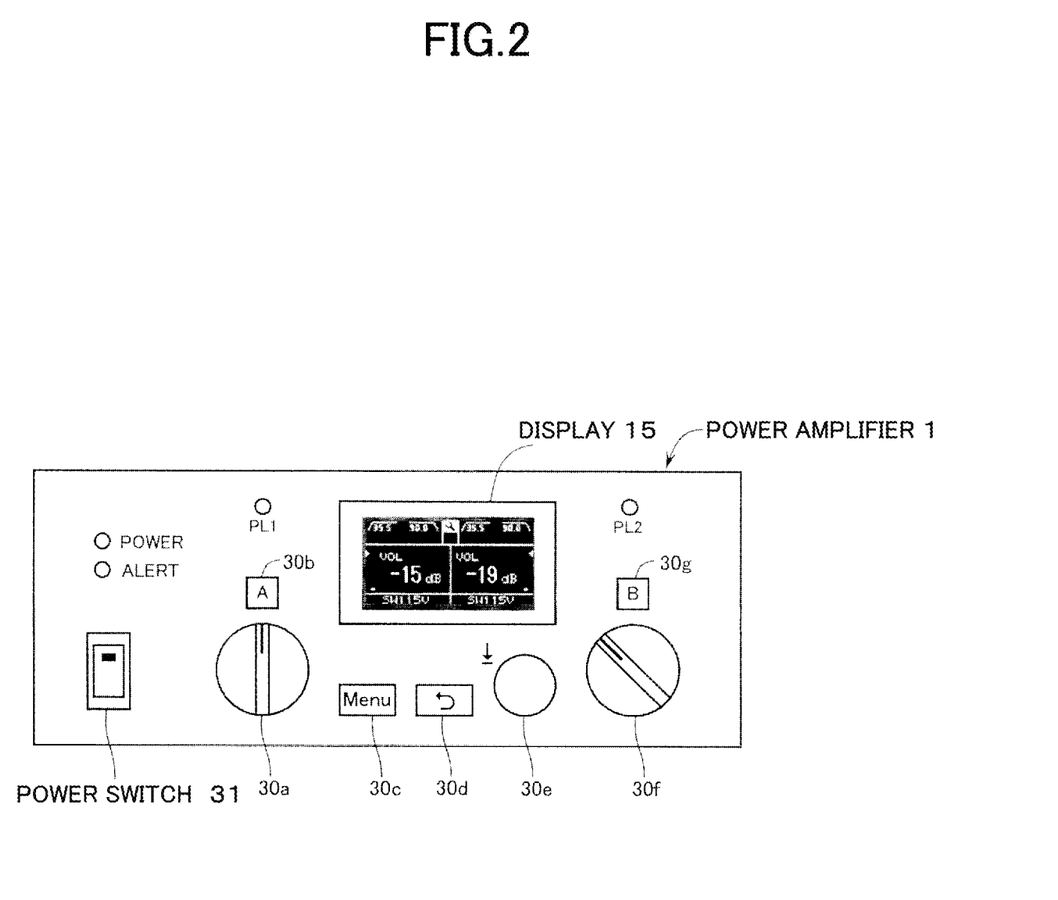
FIG. 2 is a diagram for illustrating an operation panel of the power amplifier (1).

A configuration of an operation panel of the power amplifier 1 is illustrated in FIG. 2. As illustrated in FIG. 2, the display 15, which has a rectangular shape, is provided on the upper side in the center of the operation panel, and a power switch 31 of a seesaw type is provided in a lower portion on the left side. To the right of the switch 31, an Ach knob 30a, which is used to control a gain of the sound signal of channel A, and an Ach button 30b, which is labeled "A", are arranged vertically. To the right of the Ach knob 30a and the Ach button 30b, a menu key (Menu) 30c and a return key 30d are arranged horizontally side by side. Further, to the right of the menu key (Menu) 30c and the return key 30d, a rotary encoder (hereinafter referred to as "encoder") 30e with a push switch is arranged. To the right of the encoder, a Bch knob 30f, which is used to control a gain of the sound signal of channel B, and a Bch button 30g, which is labeled "B", are arranged vertically. Moreover, a power lamp (POWER) and an alert lamp (ALERT) are arranged above the power switch 31, a first lamp (PL1) is arranged above the Ach button 30b, and a second lamp (PL2) is arranged above the Bch button 30g. When a user operates the Ach knob 30a or the Bch knob 30f, a signal gain of channel A or channel B in the amplifier 1 is controlled by the CPU 10 depending on an operation amount of the knob. In FIG. 2, a home screen, which mainly displays current gains of channel A and channel B, is displayed on the display 15.

Figure 3:
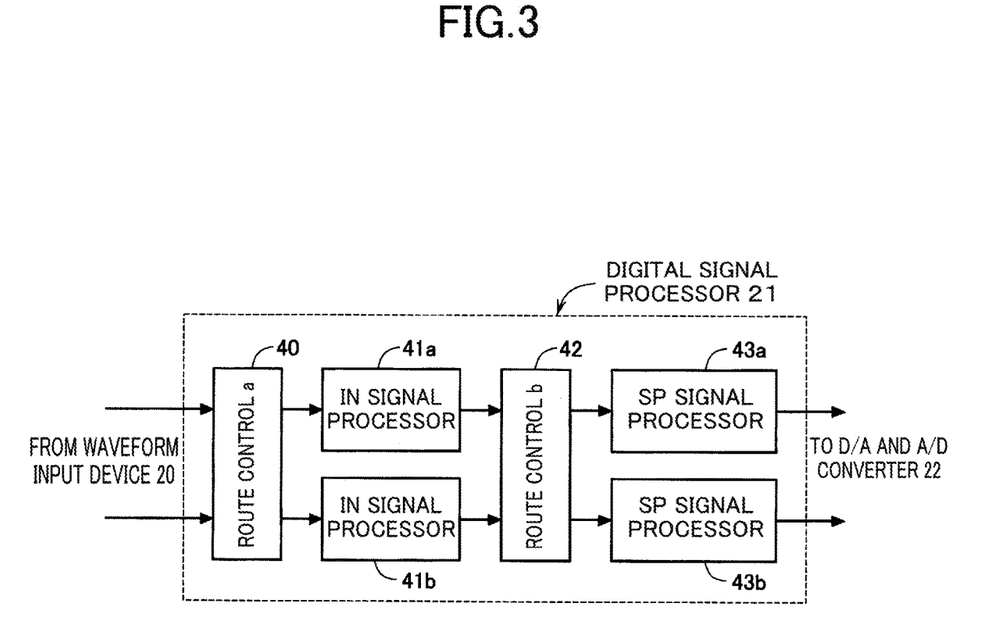
FIG. 3 is a block diagram for illustrating a signal processing algorithm of a digital signal processor (21) of the power amplifier (1).

Next, FIG. 3 is a block diagram of the signal processing executed by the digital signal processor 21. Arrows in the upper stage indicate channel A, and arrows in the lower stage indicate channel B.

Figure 5:
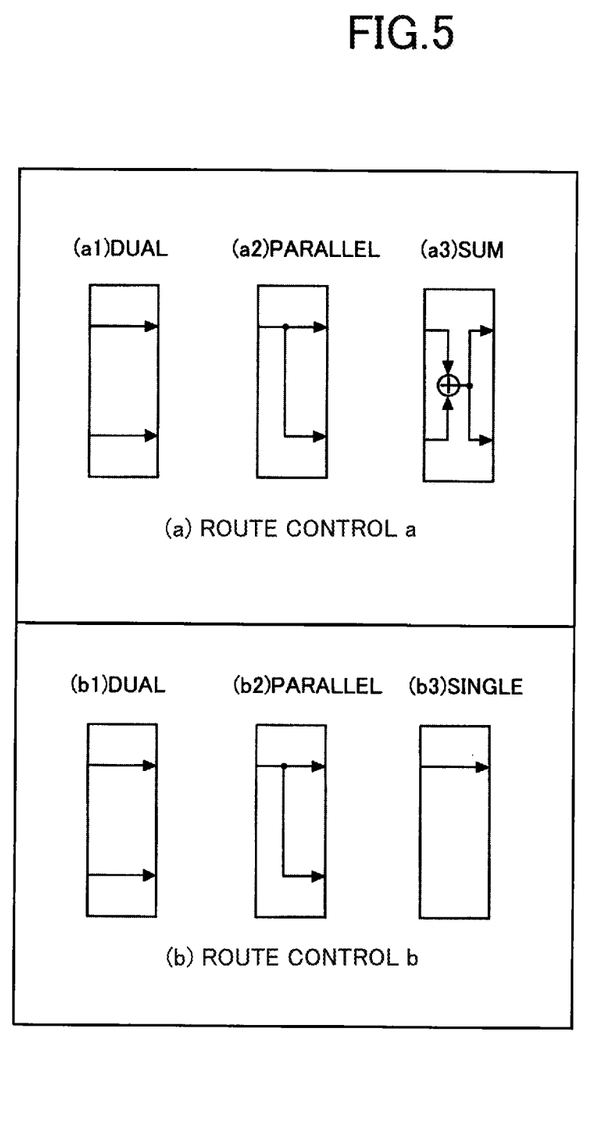
FIG. 5 is a diagram for illustrating connections within route control a and b of the digital signal processor (21).

As illustrated in FIG. 3, the two sound signals of channel A and channel B, which are input from the waveform input device 20, are supplied to a block of route control a, which is denoted by a reference symbol 40. In the route control a, any one of DUAL/PARALLEL/SUM connections, which are illustrated in part (a) of FIG. 5, is made depending on an input configuration selected by the user. In DUAL connection (a1), the supplied sound signal of channel A is output as a sound signal of channel A, and the supplied sound signal of channel B is output as a sound signal of channel B. In PARALLEL connection (a2), the supplied sound signal of channel A is output as two sound signals of channel A and channel B. In SUM connection (a3), the supplied two sound signals of channel A and channel B are mixed, and a sound signal obtained as a sum of the two sound signals is output as two sound signals of channel A and channel B. The two sound signals of channel A and channel B, which are output from the route control a, are respectively supplied to two IN signal processors 41a and 41b, which are configured to perform input-side processing. The IN signal processors 41a and 41b of the respective channels each perform common signal processing on the supplied sound signals by a plurality of blocks (for example, a multiband compressor and a delay device), which are connected in series, irrespective of speakers connected to the respective channels. Parameter sets used by the respective blocks of the IN signal processors for the signal processing are initialized to predetermined values when the configuration data set, which is to be described later, is applied.

Figure 4:
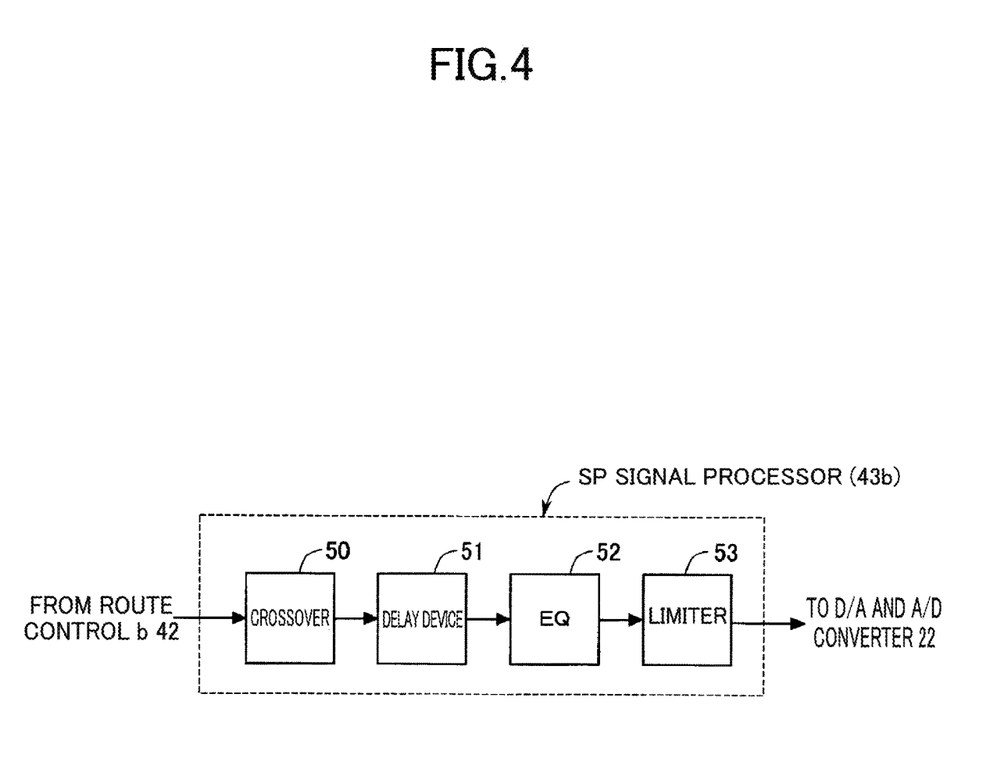
FIG. 4 is a block diagram for illustrating an algorithm of an SP signal processor (43) of the digital signal processor (21).

Moreover, the sound signals of channel A and channel B, which are output from the IN signal processors 41a and 41b, are supplied to a block of route control b, which is denoted by a reference symbol 42. In the route control b, any one of DUAL/PARALLEL/SINGLE connections, which are illustrated in part (b) of FIG. 5, is made depending on the input configuration selected by the user. In DUAL connection (b1), the supplied sound signal of channel A is output as a sound signal of channel A, and the supplied sound signal of channel B is output as a sound signal of channel B. In PARALLEL connection (b2), the supplied sound signal of channel A is output as two sound signals of channel A and channel B. In SINGLE connection (b3), the supplied sound signal of channel A is output as a sound signal of channel A, and a silent sound signal is output as a sound signal of channel B. The two sound signals of channel A and channel B, which are output from the route control b, are respectively supplied to two SP signal processors 43a and 43b, which are configured to perform signal processing corresponding to the speakers 3 connected to the respective channels. FIG. 4 is a block diagram of an example of the signal processing of each of the SP signal processors 43a and 43b. As illustrated in FIG. 4, each of the SP signal processors 43a and 43b is formed of a plurality of blocks of a crossover 50, a delay device 51, an equalizer (EQ) 52, and a limiter 53, which are connected in tandem. Parameter sets used by the respective blocks of the SP signal processor are initialized based on the amplifier mode and the SP preset, which are to be described later, when the configuration data set is applied.

There are various types of speakers 3 to be connected to the power amplifier 1, and there are various combinations of the speakers. For example, the speakers 3 include a type (FULL: full-range system) that covers the full audible range of from a low range to a high range, and a type (SUB: subwoofer) that is in charge of the low range in the audible range. The full-range systems further include a type (BI-AMP) that includes a terminal for low-range speaker and a terminal for high-range speaker to allow bi-amp connection. These types of speakers are used in combination as appropriate depending on a purpose of use. Depending on the types and modes of use of the speakers 3 to be connected to the amplifier 1, an input configuration and an output configuration of the digital signal processor 21 are set. The "output configuration" is set by the user depending on the types and the modes of use of the one or two speakers 3 to be connected to two output terminals of channel A and channel B of the amplifier 1. Then, depending on the set "output configuration", a configuration (to what types of speakers the sound signals are output) of the two sound signals output by the amplifier 1 is determined. Moreover, the "input configuration" is set by the user depending on whether to use all or a part of input signals of a plurality of channels of the amplifier 1, and when all are used, whether or not to mix the input signals before using the input signals. Depending on the set "input configuration", a configuration (the number of input signals to be used) of the sound signals received by the amplifier 1, and a configuration (input signal of which channel, or mixed signal) of a sound signal received by each processing block in the digital signal processor 21 are determined.

Based on the output configuration and the input configuration that have been set, the amplifier mode, which defines what type of speaker 3 is connected and what type of signal is input to the power amplifier 1, is determined. In the configuration method of the power amplifier according to this disclosure, the user first selects one output configuration, then selects an input configuration from among restricted candidates, and selects one amplifier mode based on the output configuration and the input configuration that have been selected.

Figure 6:
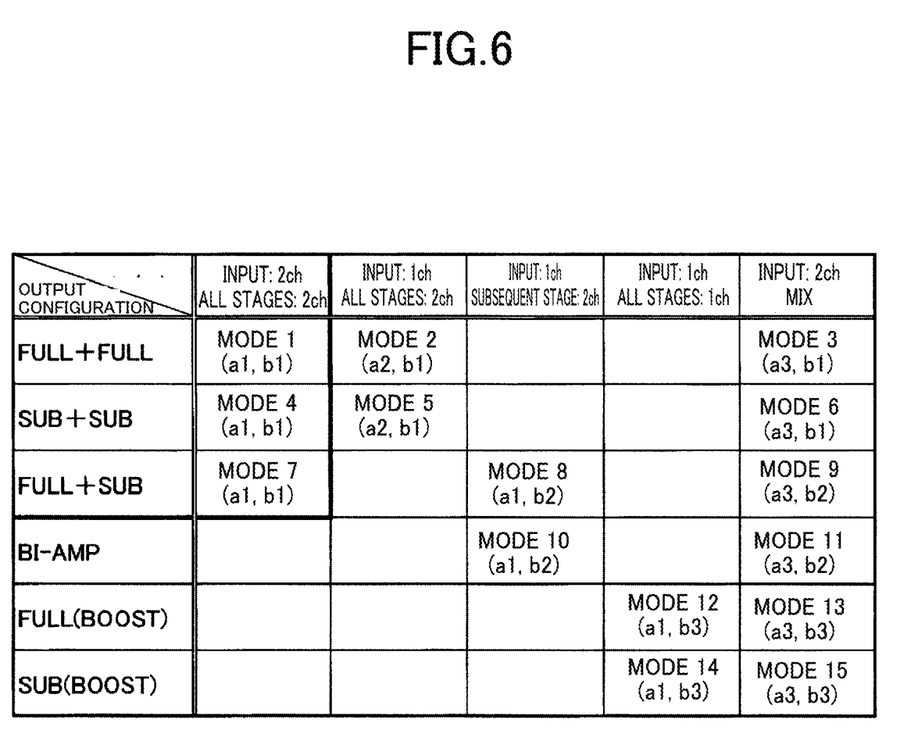
FIG. 6 is a table for showing amplifier modes to be selected in the power amplifier (1) and the route control a and b corresponding to each amplifier mode.

A table of amplifier modes, which is shown as a matrix of a plurality of output configurations and a plurality of input configurations, which are provided as choices, is shown in FIG. 6. The table shown in FIG. 6 includes rows of six output configurations, and columns of five input configurations. There are a total of 30 selection cells in the table, and an amplifier mode can be set for each selection cell. However, this disclosure has features that amplifier modes of low necessity are omitted, and that the choices are limited to a limited number of modes, for example, 15 modes. One of 15 amplifier modes shown in FIG. 6 is selected based on the output configuration and the input configuration that have been selected by the user. Each choice of the output configuration is described below. The output configuration "FULL+FULL" is an output configuration in which a total of two speaker systems (full-range systems) of the type (FULL type) that covers the full audible range are connected to the two output terminals, one for each output terminal, of channel A and channel B of the amplifier 1. The speaker systems are not limited to 1-way, but may be 2-way or 3-way. In this case, a sound signal in the full audible range is supplied from the amplifier 1 to each speaker system.

The output configuration "SUB+SUB" is an output configuration in which, a total of two speaker systems (subwoofers) of the type (SUB type) that is in charge of the low range of audible frequencies are connected to the two output terminals, one for each output terminal, of channel A and channel B of the amplifier 1. When the corresponding configuration data set is applied, a sound signal in the low range is supplied from the amplifier 1 to each speaker system.

The output configuration "FULL+SUB" is an output configuration in which a speaker system of the FULL type is connected to the output terminal of channel A of the amplifier 1, and in which a speaker system of the SUB type is connected to the output terminal of channel B of the amplifier 1. When the corresponding configuration data set is applied, a sound signal obtained by cutting off the low range from the full audible range is supplied from the amplifier 1 to the speaker system of the FULL type, and a sound signal of the low range is supplied to the speaker system of the SUB type.

The output configuration "BI-AMP" is an output configuration in which a speaker system of a type (BI-AMP type) that allows the bi-amp connection is prepared, and in which the terminal for high-range speaker of the speaker system of the BI-AMP type is connected to the output terminal of channel A of the amplifier 1, and the terminal for low-range speaker of the speaker system of the BI-AMP type is connected to the output terminal of channel B of the amplifier 1 for bi-amp driving. When the corresponding configuration data set is applied, a sound signal obtained by cutting off the low range from the full audible range is supplied from the amplifier 1 to the terminal for high-range speaker, and a sound signal of the low range is supplied to the terminal for low-range speaker.

The output configuration "FULL (BOOST)" is an output configuration in which one speaker system of the FULL type is connected to the output terminal of channel A of the amplifier 1, and in which all power that can be supplied by the analog power amplifier 23 is used for power amplification in channel A to drive the one speaker system more powerfully. Through outputting a silent signal from channel B of the amplifier 1 and reducing a restriction of a protection circuit for the output of channel B, the one speaker system can sound louder than when two speaker systems are connected (boost operation). When the corresponding configuration data set is applied, the sound signal in the full audible range is supplied from the amplifier 1 to the speaker system of channel A, and if a speaker is connected to channel B, the speaker system is supplied with the silent sound signal and produces no sounds.

The output configuration "SUB (BOOST)" is an output configuration in which one speaker system of the SUB type is connected to the output terminal of channel A of the amplifier 1, and all power is used for the power amplification of channel A to drive the speaker system powerfully. As in the above description, the one speaker system can sound louder (boost operation).

Next, the input configuration specified by the user is described. In the input configuration "input: 2ch, all stages: 2ch", the user inputs two independent sound signals to channel A and channel B of the amplifier 1. The input configuration "input: 2ch, all stages: 2ch" is an input configuration in which, based on the corresponding configuration data set, the amplifier 1 processes the input signal of channel A in the IN signal processor 41a and the SP signal processor 43a, and processes the input signal of channel B in the IN signal processor 41b and the SP signal processor 43b.

In the input configuration "input: 1 ch, all stages: 2ch", the user inputs one sound signal to channel A of the power amplifier 1. The input configuration "input: 1 ch, all stages: 2ch" is an input configuration in which, based on the corresponding configuration data set, the amplifier 1 processes in parallel the input signal of channel A in the IN signal processor 41a and the SP signal processor 43a and in the IN signal processor 41b and the SP signal processor 43b.

In the input configuration "input: 1ch, subsequent stage: 2ch", the user inputs one sound signal to channel A of the amplifier 1. The input configuration "input: 1ch, subsequent stage: 2ch" is an input configuration in which, based on the corresponding configuration data set, the amplifier 1 processes the input signal of channel A in the IN signal processor 41a, and then processes in parallel the processed sound signal in the SP signal processors 43a and 43b.

The input configuration "input: 1ch, all stages: 1ch" is an input configuration for the boost operation, in which the user inputs one sound signal to channel A of the amplifier 1. The input configuration "input: 1ch, all stages: 1ch" is an input configuration in which, based on the corresponding configuration data set, the amplifier 1 processes the input signal of channel A in the IN signal processor 41a and the SP signal processor 43a.

The input configuration "input: 2ch, mix" is an input configuration for the boost operation, in which the user inputs two independent sound signals to channel A and channel B of the amplifier 1. The input configuration "input: 2ch, mix" is an input configuration in which, based on the corresponding configuration data set, the amplifier 1 mixes the two input signals, and in a manner similar to the input configuration "input: 1ch, ** ("*" is a wildcard)" described above, performs IN signal processing and SP signal processing on a sound signal obtained as a sum of the two input signals. In this case, depending on the "output configuration", a path of the IN signal processing and the SP signal processing is uniquely determined.

Referring to the table of amplifier modes of FIG. 6, when any one of the output configurations is first selected by the user, the input configurations are restricted by the selected output configuration, and the restricted input configurations become selectable. For example, when the user selects the output configuration "FULL+FULL", any one of the input configurations: "input: 2ch, all stages: 2ch", "input: 1ch, all stages: 2ch", and "input: 2ch, mix" can be selected. Next, when the user selects one of the selectable input configurations, the amplifier 1 selects one amplifier mode corresponding to the output configuration and the input configuration that have been selected, and applies the configuration data set corresponding to the mode to the digital signal processor 21. For example, when the input configuration "input: 2ch, all stages: 2ch" is selected, the amplifier mode of mode 1 is selected. In the amplifier 1 of mode 1, the route control a is set to DUAL connection (a1) such that the input signal of channel A is processed in the IN signal processor 41a, and the input signal of channel B is processed in the IN signal processor 41b. Then, the route control b is set to DUAL connection (b1) such that the sound signal processed in the IN signal processor 41a is processed in the SP signal processor 43a, and the sound signal processed in the IN signal processor 41b is processed in the SP signal processor 43b. Those settings of the route control a and the route control b are collectively expressed as "(a1, b1)" (FIG. 6). When the configuration data set is applied, initialized values are set to the parameter sets of the blocks of the SP signal processors 43a and 43b based on the configuration data set of the selected mode 1 and two SP presets corresponding to two speaker systems of the FULL type (two "FULL" systems) selected by the user depending on the speakers 3 connected to outputs of channel A and channel B. In this mode 1, the sound signals of the full audible frequency band, on which signal processing suitable for the two connected speakers 3 has been performed, are output from channel A and channel B of the amplifier 1.

In the memory 11, the plurality of configuration data sets corresponding to the plurality of amplifier modes are stored. Each configuration data set includes setting of the route control a and b, speaker information for specifying types of two speakers to be connected to channel A and channel B, and processing information for determining a type of processing performed in each block of the two SP signal processors. Each configuration data set defines the path of the sound signal from the input devices to the output devices of the digital signal processor 21, and the signal processing in the path. In other words, through applying the configuration data set corresponding to the amplifier mode to the digital signal processor 21, operation of the power amplifier 1 in the amplifier mode is achieved.

Meanwhile, the speakers 3 to be connected to the outputs of the power amplifier 1 include the following types: FULL, SUB, and BI-AMP. From the amplifier 1 to a connected speaker 3, the sound signal that has been adjusted depending on a frequency characteristic and a phase characteristic of the speaker 3, for example, and that has been limited in power depending on an allowable input of the speaker 3, is supplied. With the sound signal, performance of the speaker 3 can be sufficiently exploited. Therefore, when the amplifier mode is selected, the amplifier 1 initializes a parameter set (plurality of parameters) for each block of the SP signal processor 43a (43b) based on the SP preset selected by the user depending on the connected speaker 3. The SP preset of each speaker is a parameter set prepared for the speaker by a manufacturer of the speaker, for example. The SP preset includes a parameter for flattening the frequency characteristic, a parameter indicating delay time, a parameter indicating the allowable input, and a recommended cutoff frequency, for example.

Now, the signal processing in the respective blocks of each SP signal processor of FIG. 4 is described. The crossover 50 extracts, depending on a combination of the connected speakers 3, a sound signal in the low range or a sound signal in the high range from the input sound signals based on a specified cutoff frequency. Whether to extract one of the high range and the low range from the sound signal in the crossover 50 of each channel for output, or to directly output the sound signal is specified by the configuration data set of the selected amplifier mode. For example, when the output configuration "FULL+SUB" or "BI-AMP" is specified by the user, the crossover 50 determines a cutoff frequency based on the SP preset selected by the user, divides the input signal of channel A into sound signals of the low range and the high range at the cutoff frequency, and outputs the sound signals of the low range and the high range from channel A and channel B, respectively. Moreover, the EQ 52 is an equalizer configured to adjust the frequency characteristic of the sound signal. In this example, the EQ 52 is used to flatten the frequency characteristic of a sound emitted from the connected speaker 3. This EQ 52 may be used to produce a sound to be close to a desired frequency characteristic. The limiter 53 limits a level of the sound signal such that a power value of an output from the analog power amplifier 23 does not exceed a specified limit value. The limit value used in the limitation by the limiter 53 is set depending on power that can be output by the analog power amplifier 23 and the allowable input of the connected speaker 3. The limiter 53 reduces the limit value during the BOOST operation to enable large output. Moreover, the delay device 51 delays the sound signal by specified delay time for output. In general, the delay device 51 is used to match phases of sounds emitted from a plurality of speakers 3 with each other, but is used to match phases of a high-range speaker and a low-range speaker especially in the cases of the output configurations of "FULL+SUB" and "BI-AMP".

For example, when the user selects the output configuration "FULL+FULL" and the input configuration "input: 1ch, all stages: 2ch", the amplifier 1 selects corresponding mode 2, and applies the configuration data set of mode 2 to the digital signal processor 21. As a result, (a2, b1) is set to the route control a and b. In other words, the route control a is set to PARALLEL connection (a2), and the route control b is set to DUAL connection (b1). At this time, initialized values are set to the parameter sets of the SP signal processors 43a and 43b based on the configuration data set of mode 2 and two SP presets of the two speaker systems of the FULL type (two "FULL" systems) selected by the user. A sound signal of the full audible range, on which signal processing (for example, flattening of the frequency characteristic, phase control, and power limitation) suitable for the connected two speakers 3 of the "FULL" type has been performed, is output from channel A and channel B of the amplifier 1.

When the user selects the output configuration "FULL+FULL" and the input configuration "input: 2ch, mix", the amplifier 1 selects corresponding mode 3, and applies the configuration data set of mode 3 to the digital signal processor 21. As a result, (a3, b1) is set to the route control a and b. The parameter sets of the SP signal processors 43a and 43b are initialized based on the configuration data set of mode 3 and two SP presets of two "FULL" systems selected by the user.

When the user selects the output configuration "FULL+SUB" and the input configuration "input: 1ch, subsequent stage: 2ch", the amplifier 1 selects corresponding mode 8, and applies the configuration data set of mode 8 to the digital signal processor 21. As a result, (a1, b2) is set to the route control a and b. Initialized values are set to the parameter sets of the SP signal processors 43a and 43b based on the configuration data set of mode 8 and two SP presets of "SUB" and "FULL" systems selected by the user. To the speaker 3 of the SUB type ("SUB" system) connected to channel A of the amplifier 1, the sound signal of the low range extracted from the input signal of channel A based on the cutoff frequency in the crossover 50 of channel A is output after further being subjected to the signal processing suitable for the speaker 3. To the speaker 3 of the FULL type ("FULL" system) connected to channel B of the amplifier 1, the sound signal of the high range extracted from the input signal of channel A based on the cutoff frequency in the crossover 50 of channel B is output after further being subjected to the signal processing suitable for the speaker 3. At this time, cutoff frequencies for extracting the sound signals of the high range and the low range is required to be matched with each other. The amplifier 1 determines one cutoff frequency based on the two SP presets of the "FULL" and "SUB" systems selected by the user. For example, when a recommended cutoff frequency of the SP preset of the "FULL" system is lower than a recommended cutoff frequency of the SP preset of the "SUB" system, the cutoff frequency of the "FULL" system may be increased to match the (recommended) cutoff frequency of the "SUB" system. Alternatively, when the recommended cutoff frequency of the SP preset of the "FULL" system is higher than the recommended cutoff frequency of the SP preset of the "SUB" system, the cutoff frequency of the "SUB" system may be increased to match the (recommended) cutoff frequency of the "FULL" system.

When the user selects the output configuration "SUB+SUB" and the input configuration "input: 2ch, all stages: 2ch", the amplifier 1 selects corresponding mode 4, and applies the configuration data set of mode 4 to the digital signal processor 21. As a result, (a1, b1) is set to the route control a and b. To the parameter sets of the SP signal processors 43a and 43b, the configuration data set of mode 4 and two SP presets of two "SUB" systems selected by the user are applied. To the speaker 3 of the "SUB" type connected to channel A of the amplifier 1, the sound signal of the low range extracted from the input signal of channel A based on the cutoff frequency suitable for the speaker 3 in the crossover 50 is output. To the speaker 3 of the "SUB" type connected to channel B of the amplifier 1, the sound signal of the low range extracted from the input signal of channel B based on the cutoff frequency suitable for the speaker 3 in the crossover 50 is output. As the cutoff frequency of each channel, the recommended cutoff frequency included in the SP preset selected in the channel is used.

When the user selects the output configuration "BI-AMP" and the input configuration "input: 1ch, subsequent stage: 2ch", the amplifier 1 selects corresponding mode 10, and applies the configuration data set of mode 10 to the digital signal processor 21. As a result, (a1, b2) is set to the route control a and b. Initialized values are set to the parameter sets of the respective blocks of the SP signal processors 43a and 43b based on the configuration data set of mode 10 and one SP preset corresponding to one speaker system of the "BI-AMP" type selected by the user. To a terminal for low-range speaker of a speaker 3 of the BI-AMP type connected to channel A of the amplifier 1, the sound signal of the low range extracted based on the cutoff frequency in the crossover 50 of channel A is output. To a terminal for high-range speaker of the speaker 3 connected to channel B of the amplifier 1, the sound signal of the high range extracted based on the cutoff frequency in the crossover 50 of channel B is output. In an SP preset of the "BI-AMP" system, the same (one) cutoff frequency is used for extracting the sound signals of the high range and the low range, and is directly set to the two crossovers 50.

When the user selects the output configuration "BI-AMP" and the input configuration "input: 2ch, mix", the amplifier 1 selects corresponding mode 11, and applies the configuration data set of mode 11 to the digital signal processor 21. As a result, (a3, b2) is set to the route control a and b. Initialized values are set to the parameter sets of the SP signal processors 43a and 43b based on the configuration data set of mode 11 and one SP preset of the "BI-AMP" system selected by the user.

When the user selects the output configuration "FULL (BOOST)" and the input configuration "input: 1ch, all stages: 1ch", the amplifier 1 selects mode 12, and applies the configuration data set of mode 12 to the digital signal processor 21. As a result, (a1, b3) is set to the route control a and b. Initialized values are set to the parameter set of the respective blocks of the SP signal processor 43a based on the configuration data set of mode 12 and the SP preset of the speaker system of the "FULL" type selected by the user.

Figure 8:
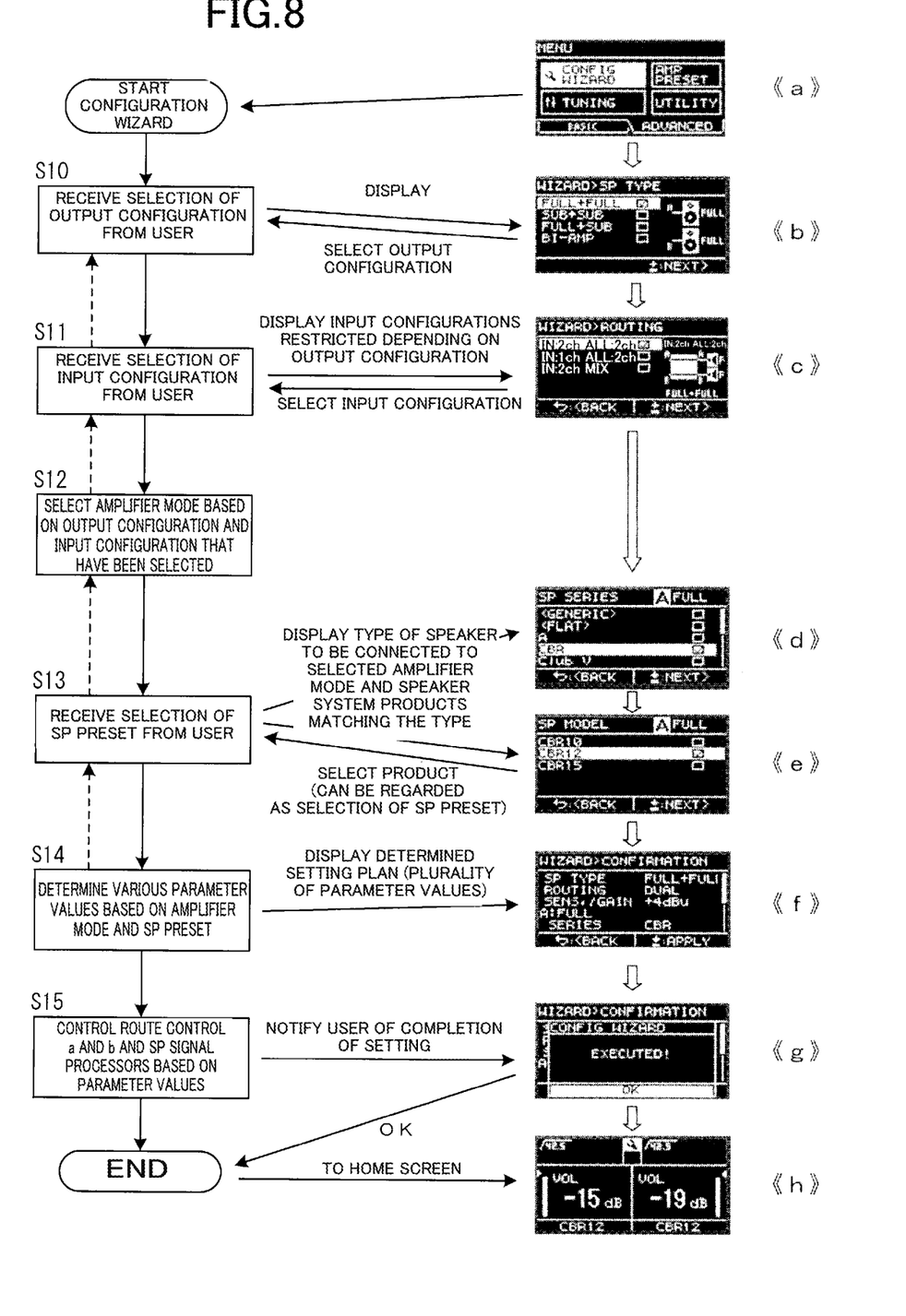
FIG. 8 is a flow chart of configuration wizard processing in this disclosure, and diagrams for illustrating display screens displayed in respective processing steps.

FIG. 8 is a flow chart of configuration wizard processing of the power amplifier 1 according to this disclosure, and diagrams for illustrating display screens displayed in respective processing steps.

Figure 7A:
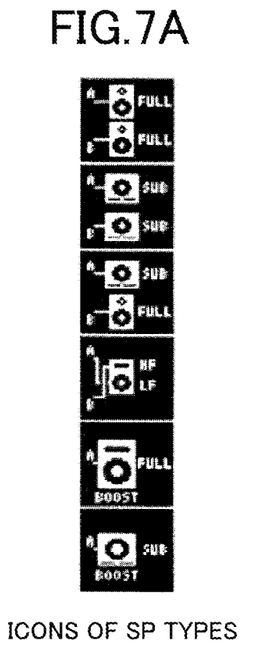
FIG. 7A and FIG. 7B are diagrams for illustrating icon examples of output configurations and icon examples of the amplifier modes, respectively, which are displayed in power amplifier setting processing in this disclosure.

When the user pushes the menu key (Menu) 30c of the panel, the CPU 10 displays a "MENU" screen «a» on the display 15. In this "MENU" screen, when the user rotates the encoder 30e of the panel to move a cursor in the screen to "CONFIG WIZARD" and pushes the encoder 30e, the CPU 10 starts the configuration wizard processing. In this manner, the push switch of the encoder 30e serves as an enter key. Moreover, with the rotation of the encoder 30e, the cursor is moved in one screen, and a parameter value is changed in another screen. When an icon is placed on a text, the text is displayed as black characters against a white background. When an icon is not placed on a text, the text is displayed as white characters against a black background. Moreover, in each selection screen to be described below, a check box for each choice is displayed, and a check box of a choice that is selected last is checked. When the configuration wizard processing is started, the CPU 10 displays an "SP TYPE" screen «b» on the display 15 in Step S10. In the "SP TYPE" screen, one of the six output configurations may be provisionally selected by the user rotating the encoder 30e to move the cursor while scrolling. In a right part in the screen, an icon (FIG. 7A) corresponding to the provisionally selected output configuration is displayed. When a desired output configuration is selected, the user pushes the encoder 30e to confirm the selection of the output configuration. The CPU 10 checks a rectangular check box of the output configuration, and proceeds to Step S11 ("NEXT"). This Step S10 corresponds to a function of a first receiver of receiving, from the user, selection of one output configuration from among the plurality of output configurations.

Figure 7B:
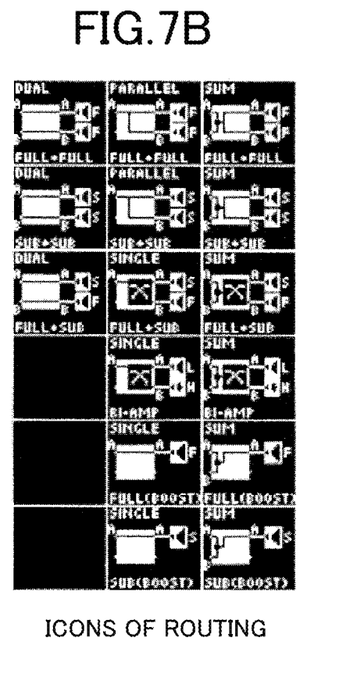

In Step S11, the CPU 10 displays a "ROUTING" screen «c» on the display 15. In this "ROUTING" screen, input configurations restricted depending on the output configuration selected in Step S10 are displayed, and the user moves the cursor to provisionally select any one of the input configurations. For example, when the output configuration "FULL+FULL" is selected in Step S10, three input configurations: "IN:2CH ALL:2CH" (input: 2ch, all stages: 2ch), "IN:1CH ALL:2CH" (input: 1ch, all stages: 2ch), and "IN:2CH MIX" (input: 2ch, mix) are displayed. When a desired input configuration is selected, the user pushes the encoder 30e to confirm the selection of the input configuration. In a right part in the screen, an icon (FIG. 7B) of one amplifier mode corresponding to the selected output configuration and the provisionally selected input configuration is displayed. The CPU 10 checks a rectangular check box of the input configuration, and proceeds to Step S12 ("NEXT"). This Step S11 corresponds to a function of a second receiver of receiving, from the user, selection of one input configuration from among the input configurations restricted by the selected output configuration. When the user pushes the return key 30d during the processing of Step S11, the CPU 10 returns to the previous processing (S10) ("BACK"), and executes the processing of selecting an output configuration again.

The icon (FIG. 7B) of each amplifier mode displayed at this time includes texts of the input configuration and the output configuration of the amplifier mode, and a schematic diagram of processing in the amplifier mode. In the example of the screen «c», with the output configuration "FULL+FULL" being selected and the input configuration "IN:2CH ALL:2CH" being provisionally selected, an icon of corresponding "mode 1 (a1, b1)" is displayed. In Step S12, the CPU 10 selects one amplifier mode (for example, mode 1) corresponding to the output configuration and the input configuration that have been selected, and proceeds to Step S13. This Step S12 corresponds to a function of a selector of selecting one amplifier mode from among the plurality of amplifier modes based on the selected output configuration and the selected input configuration.

In Step S13, the CPU 10 first displays an "SP SERIES" screen «d» on the display 15. In the "SP SERIES" screen «d», a subject channel, a type of a speaker to be connected to the channel in the selected amplifier mode, and products of speaker systems matching the type as candidates for selection are displayed. In the memory 11, one SP preset is stored to correspond to each product, and hence selection of one product at this time can be regarded as selection of corresponding one SP preset. Moreover, when all products matching one type are displayed in this screen, the number of products is too large for the user to select. Therefore, in this example, the user selects one product in two stages: first, a series of products, and then, an individual product. In the example of the "SP SERIES" screen of channel A, which is denoted by «d», the subject channel is "A", and the speaker type is "FULL". As the candidates for selection, three series "A", "CBR", and "Club V" including products of the "FULL" type and texts "<GENERIC>" and "<FLAT>" indicating general products are displayed. At this time, the user moves the cursor to provisionally select any one of the series or the general products. When a desired series or general product is provisionally selected, the user pushes the encoder 30e to confirm the selection of the series or general product. The CPU 10 checks a corresponding rectangular check box, and proceeds to the next processing ("NEXT") in Step S13. In the screen «d», the "CBR" series is selected. When the user pushes the return key 30d during the above-mentioned processing, the CPU 10 returns to the previous processing (S11) ("BACK") such that the processing of selecting an input configuration can be executed again.

In the next processing in Step S13, the CPU 10 displays an "SP MODEL" screen «e» on the display 15. In the "SP MODEL" screen «e», a subject channel "A", a speaker type "FULL" of the subject channel, and products corresponding to the "FULL" type of the selected "CBR" series are displayed. At this time, the user moves the cursor to provisionally select any one of the products. When a desired product (SP preset) is selected, the user pushes the encoder 30e to confirm the selection of the product (SP preset). The CPU 10 checks a corresponding rectangular check box. When the selected configuration data set specifies a speaker type of channel B in addition to channel A (mode 1 to mode 9), the CPU 10 proceeds to the next processing in Step S13. When the selected configuration data set specifies only the speaker type of channel A (mode 10 to mode 15), the CPU 10 proceeds to Step S14. When the user pushes the return key 30d during the above-mentioned processing, the CPU 10 returns to the previous processing ("BACK"), and executes the processing of selecting a series again. When the speaker type of channel A of the selected configuration data set is "FULL", in the "SP MODEL" screen of channel A, only products (SP presets) of the "FULL" type are displayed as the candidates for selection. Moreover, when the speaker type of channel A is "SUB", only products of the "SUB" type are displayed as the candidates for selection in the screen, and when the speaker type of channel A is "BI-AMP", only products of the "BI-AMP" type are displayed in the screen as the candidates for selection.

Although not shown, when the speaker type of channel B is the same as channel A in the next processing in Step S13, the CPU 10 displays, on the display 15, a screen inquiring of the user whether to select the product selected in channel A also in channel B. At this time, when the user responds to select such product, the CPU 10 selects the same product (SP preset) as channel A also in channel B, and proceeds to Step S14. At this time, when the user responds not to select such product, or when the speaker type of channel B is different from channel A, the CPU 10 receives, from the user, selection of one series in an "SP SERIES" screen of channel B as in the case of channel A described above, and then receives, from the user, selection of one product (SP preset) in an "SP MODEL" screen. When the user pushes the return key 30d during each selection processing, the CPU 10 returns to the previous selection processing ("BACK"), and executes the previous selection processing again. Then, when the selection of the SP presets of channel A and channel B is finished, the CPU 10 proceeds to Step S14.

In Step S14, the CPU 10 determines, based on the configuration data set of the selected amplifier mode and the selected one or two SP presets, one setting plan (plurality of parameter values) including settings of the route control a and b and the parameter sets of the SP signal processors 43a and 43b. Then, the CPU 10 displays a "CONFIRMATION" screen «f» including the determined setting plan on the display 15. The user rotates the encoder 30e to scroll through the setting plan in the "CONFIRMATION" screen, and confirms each parameter value of the setting plan. When there is no problem, the user pushes the encoder 30e to instruct application. As a result, the CPU 10 proceeds to Step S15 ("APPLY"). Alternatively, when there is any problem, the user operates the return key 30d, and the CPU 10 returns to the previous processing (S13) ("BACK") to execute the selection of the SP preset of channel A or channel B that have been performed last.

In Step S15, the CPU 10 sets the parameter values of the setting plan determined in Step S14 as initial values to the parameter sets of the route control a and b and the SP signal processors 43a and 43b, for example, and applies the setting plan to those signal processors. When the setting of the parameter values is complete, the CPU 10 displays a "CONFIG WIZARD" screen including a text "EXECUTED!" on the display 15. With the display, the user recognizes that the setting of the power amplifier 1 is finished. For example, when mode 1 is selected, and "CBR12" is selected in channel A and channel B, a sound signal obtained by performing signal processing suitable for CBR12 on the input signal of channel A and power-amplifying the processed signal is output from channel A of the amplifier 1. A sound signal obtained by performing signal processing suitable for CBR12 on the input signal of channel B and power-amplifying the processed signal is output from channel B of the amplifier 1. The above-mentioned Steps S14 and S15 correspond to a function of an applier of selecting the configuration data set corresponding to the selected amplifier mode from among the plurality of configuration data sets and applying the configuration data set to the signal processing performed by the signal processor.

At this time, when the user pushes the encoder 30e ("OK"), the CPU 10 ends the configuration wizard processing. Moreover, the CPU 10 displays a home screen «h» on the display 15. In this home screen, products (for example, "CBR12") of channel A and channel B that are selected last in the configuration wizard processing are displayed along with the current gains of channel A and channel B. In the home screen of FIG. 2 before executing the configuration wizard processing, other products ("SW115V") are displayed for channel A and channel B. Each parameter value set based on the setting plan is not a fixed value, and may be individually adjusted by the user in another screen (not shown).

Through the application of the setting plan in the configuration wizard processing, the respective blocks of the digital signal processor 21 perform the signal processing corresponding to the selected amplifier mode (configuration data set) and the selected product (SP preset). For example, in the SP signal processor 43 of the channel for which one product of the "FULL" type is selected irrespective of the mode, a parameter set is set based on the SP preset corresponding to the product. Similarly, in the SP signal processor 43 of the channel for which a "SUB" product is selected, the SP preset of the "SUB" product is applied. When any one of modes 7 to 9 is selected, and a "FULL" product and a "SUB" product are selected, the cutoff frequency in the crossover 50 of the SP signal processor 43 is determined based on two SP presets of the "FULL" product and the "SUB" product.

The user can adjust parameter values of the IN signal processors 41a and 41b and the SP signal processors 43a and 43b with the use of a user interface of the amplifier 1. For example, when the user rotates the Ach knob 30a, the CPU 10 changes the gain of channel A. Moreover, the user can enter an editing screen of the crossover 50 and select the cutoff frequency to change a value of the cutoff frequency with the use of the encoder 30e.

The embodiment of this disclosure described above relates to the 2-ch power amplifier, but this disclosure is also applicable to audio equipment other than the 2-ch audio equipment, for example, 4-ch or 8-ch audio equipment. In that case, every two channels may be paired, and the method according to this disclosure may be applied to each pair. Alternatively, a group of three or more channels may be formed, and the method according to this disclosure may be applied to each group. Moreover, the number of input devices and the number of output devices for the sound signals may be the same as in the embodiment described above. However, this disclosure is not limited thereto, and the number of input devices and the number of output devices may be different numbers.

Moreover, the configuration method of the power amplifier according to this disclosure is applicable not only to the power amplifier but also to various types of audio equipment connected to the previous stage of the power amplifier, for example, a speaker processor, or a stage box configured to extend inputs and outputs of a digital mixer. Further, when only one channel performs signal processing, channel A has been used, but channel B may be used. Further, in modes 7 to 11, the low range has been processed in channel A, and the high range has been processed in channel B. However, this may be vice versa.

In the above description, the number of choices of the output configurations has been six, but the number is not necessarily limited to six. For example, the number of choices may be three: "FULL+FULL", "SUB+SUB", and "FULL+SUB" in the table of FIG. 6. Moreover, the choices of the input configurations are not necessarily limited to those of the embodiment. In this disclosure, it is only required that the number of modes for selection be a number that is smaller than a product of the number of output configurations and the number of input configurations.

The embodiment according to this disclosure described above has features that the output configurations and the input configurations restricted depending on the output configuration are presented to the user to allow the user to specify the output configuration and the input configuration, and that the amplifier modes restricted depending on the output configuration and the input configuration that have been specified are presented to the user to allow the user to select one of the amplifier modes.

In other words, the user first selects the (easy-to-understand) output configuration, and then the user selects one input configuration from among the input configurations restricted based on the output configuration selected by the user. Based on the output configuration and the input configuration that have been selected by the user, one amplifier mode is selected from among the plurality of amplifier modes, and the configuration data set corresponding to the selected amplifier mode is applied to the signal processing performed by the signal processor. With the user first selecting the output configuration, which is relatively easy, and then selecting the input configuration from among the restricted choices, settings suitable for the mode of use of the speaker can be made easily.

Moreover, the amplifier mode selected by the user includes information as to which speaker having what characteristics is to be connected to the power amplifier, and hence there is a feature that SP presets that can be selected in the amplifier mode are restricted.

In other words, depending on the selection operation by the user, one configuration data set is first selected from among the plurality of configuration data sets. Next, speakers corresponding to the selected configuration data set are extracted from among a plurality of speakers, and the user selects one speaker from among the extracted speakers. Then, the selected configuration data set and a preset corresponding to the selected speaker are applied to the signal processing performed by the signal processor. Each configuration data set includes information as to which speaker of what type is to be connected, and with the choices of the speakers being restricted based on the type, the user can easily make the settings suitable for the mode of use of the speaker.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A configuration method of audio equipment, the audio equipment including a signal processor, which is connected to n input devices and m output devices, where n is an integer of 1 or more and m is an integer of 1 or more, the configuration method of audio equipment comprising:
   a first step of preparing a plurality of configuration data sets;
   a second step of receiving, from a user, selection of one output configuration from among a plurality of output configurations, each of the plurality of output configurations corresponding to one or more related input configurations;
   a third step of receiving, from the user, selection of one input configuration from among the input configurations corresponding to the selected one output configuration, each of combinations of one of the plurality of output configurations and corresponding one of the plurality of input configurations corresponding to one of a plurality of amplifier modes, each of the plurality of amplifier modes corresponding to one of the plurality of configuration data sets;
   a fourth step of selecting one amplifier mode from among a plurality of amplifier modes based on the combination of the selected one output configuration and the selected one input configuration; and
   a fifth step of selecting a configuration data set corresponding to the selected one amplifier mode, and applying the selected configuration data set to signal processing to be performed by the signal processor.

2. The configuration method of audio equipment according to claim 1, wherein each of the plurality of configuration data sets defines a path of a sound signal from the n input devices to the m output devices, and signal processing in the path.

3. The configuration method of audio equipment according to claim 1, wherein each of the plurality of output configurations specifies a type of at least one speaker to be connected to the m output devices.

4. The configuration method of audio equipment according to claim 3, wherein the plurality of configuration data sets specify, as the type, one of a full-range system and a low-range system.

5. The configuration method of audio equipment according to claim 4, wherein the plurality of configuration data sets include configuration data for specifying bi-amp as the type.

6. The configuration method of audio equipment according to claim 1, wherein each of the input configurations defines whether to use a part or all of n signals received by the n input devices.

7. The configuration method of audio equipment according to claim 1, wherein each of the input configurations defines whether or not to mix each pair of n signals received by the n input devices before processing the n signals.

8. The configuration method of audio equipment according to claim 1, further comprising:
   a sixth step of preparing a plurality of presets corresponding to a plurality of speakers;
   a seventh step of extracting speakers corresponding to the selected configuration data set from among the plurality of speakers; and
   an eighth step of receiving, from the user, selection of one speaker from among the extracted speakers,
   wherein the fifth step includes applying, to the signal processing to be performed by the signal processor, a preset corresponding to the selected one speaker.

9. The configuration method of audio equipment according to claim 8,
   wherein each of the plurality of configuration data sets specifies types of m speakers to be connected to the m output devices, and
   wherein the seventh step includes extracting, from among the plurality of speakers, speakers of the types specified by the each of the plurality of configuration data sets.

10. The configuration method of audio equipment according to claim 9, wherein each of the plurality of configuration data sets defines a path of a sound signal from the n input devices to the m output devices, and sound signal processing to be performed by a processing block in the path in the signal processor.

11. The configuration method of audio equipment according to claim 10,
wherein the plurality of configuration data sets specify an operation of a crossover of the processing block, and
wherein the crossover has a cutoff frequency that is determined based on the preset corresponding to the one speaker selected in the eighth step.

12. The configuration method of audio equipment according to claim 8, wherein the preset corresponding to the one speaker selected in the eighth step includes a parameter for an equalizer configured to flatten a frequency characteristic of the one speaker.

13. A configuration method of audio equipment, the audio equipment including a signal processor, which is connected to n input devices and m output devices, where n is an integer of 1 or more and m is an integer of 1 or more, the configuration method of audio equipment comprising:
   a first step of preparing a plurality of configuration data sets;
   a second step of receiving, from a user, selection of one output configuration from among a plurality of output configurations;
   a third step of receiving, from the user, selection of one input configuration from among input configurations restricted by the selected one output configuration;
   a fourth step of selecting one amplifier mode from among a plurality of amplifier modes based on the selected one output configuration and the selected one input configuration;
   a fifth step of selecting a configuration data set corresponding to the selected one amplifier mode, and applying the selected configuration data set to signal processing to be performed by the signal processor;
   a sixth step of preparing a plurality of presets corresponding to a plurality of speakers;
   a seventh step of extracting speakers corresponding to the selected configuration data set from among the plurality of speakers; and
   an eighth step of receiving, from the user, selection of one speaker from among the extracted speakers,
   wherein the fifth step includes applying, to the signal processing to be performed by the signal processor, a preset corresponding to the selected one speaker, and
   wherein the preset corresponding to the one speaker selected in the eighth step includes a parameter indicating an allowable input of the one speaker.

14. An audio equipment, comprising:
   a signal processor connected to n input devices and m output devices, where n is an integer of 1 or more and m is an integer of 1 or more;
   a first receiver configured to receive, from a user, selection of one output configuration from among a plurality of output configurations, each of the plurality of output configurations corresponding to one or more related input configurations;
   a second receiver configured to receive, from the user, selection of one input configuration from among the input configurations corresponding to the selected one output configuration, each of combinations of one of the plurality of output configurations and corresponding one of the input configurations corresponding to one of a plurality of amplifier modes, each of the plurality of amplifier modes corresponding to one of the plurality of configuration data sets;
   a selector configured to select one amplifier mode from among a plurality of amplifier modes based on the combination of the selected one output configuration and the selected one input configuration; and
   an applier configured to select a configuration data set corresponding to the selected one amplifier mode from among a plurality of configuration data sets, and apply the selected configuration data set to signal processing to be performed by the signal processor.

* * * * *